United States Patent
Tan et al.

(10) Patent No.: US 7,618,510 B2
(45) Date of Patent: Nov. 17, 2009

(54) IMPRINTING POLYMER FILM ON PATTERNED SUBSTRATE

(75) Inventors: Li Tan, Ann Arbor, MI (US); Yen-Peng Kong, Singapore (SG); Stella W. Pang, Ann Arbor, MI (US); Albert F. Yee, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 325 days.

(21) Appl. No.: 10/558,032

(22) PCT Filed: May 20, 2004

(86) PCT No.: PCT/US2004/015889

§ 371 (c)(1),
(2), (4) Date: Nov. 22, 2005

(87) PCT Pub. No.: WO2004/107403

PCT Pub. Date: Dec. 9, 2004

(65) Prior Publication Data

US 2007/0056680 A1     Mar. 15, 2007

Related U.S. Application Data

(60) Provisional application No. 60/473,302, filed on May 23, 2003.

(51) Int. Cl.
| | |
|---|---|
| B44C 1/10 | (2006.01) |
| B44C 1/18 | (2006.01) |
| B44C 1/24 | (2006.01) |
| B32B 37/10 | (2006.01) |
| B32B 37/16 | (2006.01) |
| B32B 37/02 | (2006.01) |
| B05D 1/02 | (2006.01) |
| B05D 1/18 | (2006.01) |
| H01L 21/302 | (2006.01) |
| B44C 1/17 | (2006.01) |
| B32B 37/06 | (2006.01) |
| B05D 5/12 | (2006.01) |
| B05D 1/26 | (2006.01) |
| H01L 21/306 | (2006.01) |

(52) U.S. Cl. .................. 156/240; 156/230; 156/232; 156/247; 216/13; 427/74; 427/152; 438/738; 438/782

(58) Field of Classification Search ............... 156/230, 156/247, 232, 240, 289; 216/13, 41, 96; 438/738, 778, 782; 427/74, 123, 152
See application file for complete search history.

(56) References Cited

U.S. PATENT DOCUMENTS 4,508,755 A * 4/1985 Reintjes et al. ............... 427/58

(Continued)

*Primary Examiner*—Philip C Tucker
*Assistant Examiner*—Sonya Mazumdar
(74) *Attorney, Agent, or Firm*—Harness, Dickey & Pierce, P.L.C.

(57) ABSTRACT

A method of applying a pattern on a topography includes first applying a polymer film to an elastomer member, such as PDMS, to form a pad. The pad is then applied to a substrate having a varying topography under pressure. The polymer film is transferred to the substrate due to the plastic deformation of the polymer film under pressure compared to the elastic deformation of the PDMS member. Thus, upon removal of the pad from the substrate, the PDMS member pulls away from the polymer layer, thereby depositing the polymer layer upon the substrate.

11 Claims, 6 Drawing Sheets

U.S. PATENT DOCUMENTS

| | | | |
|---|---|---|---|
| 5,147,397 A * | 9/1992 | Christ et al. | 623/6.46 |
| 5,512,131 A * | 4/1996 | Kumar et al. | 438/738 |
| 5,607,816 A * | 3/1997 | Fitzgerald et al. | 430/271.1 |
| 6,027,595 A | 2/2000 | Suleski | |
| 6,180,288 B1 * | 1/2001 | Everhart et al. | 430/2 |
| 6,355,198 B1 * | 3/2002 | Kim et al. | 264/259 |
| 6,518,168 B1 * | 2/2003 | Clem et al. | 438/623 |
| 6,770,721 B1 * | 8/2004 | Kim | 526/329 |
| 6,875,475 B2 * | 4/2005 | Moran et al. | 427/437 |
| 6,887,792 B2 * | 5/2005 | Perlov et al. | 438/703 |
| 7,050,691 B2 * | 5/2006 | Ishizaki et al. | 385/132 |
| 7,491,286 B2 * | 2/2009 | Kagan et al. | 156/230 |
| 2003/0087179 A1 * | 5/2003 | Iwasaki | 430/166 |

* cited by examiner

US 7,618,510 B2

IMPRINTING POLYMER FILM ON PATTERNED SUBSTRATE

CROSS-REFERENCE TO RELATED APPLICATIONS

This application claims the benefit of U.S. Provisional Application No. 60/473,302, filed on May 23, 2003. The disclosure of the above application is incorporated herein by reference.

FIELD OF THE INVENTION

The present invention generally relates to patterning methods and, more particularly, relates to a low-cost and high-throughput method capable of creating polymer film patterns on topography using an elastomeric polydimethylsiloxane (PDMS) pad.

BACKGROUND AND SUMMARY OF THE INVENTION

As is known, patterning of polymer thin films on topography has many applications in the fabrication of micro-electromechanical systems (MEMs) or electronic devices, such as those being used to cap micro- or nanometer-sized features or to form multi-layer structures in organic light-emitting diodes (OLEDs). However, conventional patterning methods, such as nanoimprint lithography (NIL) or microcontact printing (μCP), have many limitations. These processes produce patterns on flat surfaces. It is not only hard to form a continuous film over topography, but also very difficult to pattern films either inside trenches or on protrusions of topography 18.

As seen in U.S. Pat. Nos. 5,512,131 and 6,180,239, a method of patterning a material surface using a PDMS pad is provided, wherein a chemical species capable of forming a self-assembled monolayer (SAM) is coated onto the padding surface of the elastomer pad. The padding surface is placed against another surface of a material and removed to leave a SAM of the species according to the surface pattern of the pad.

According to the present invention polymer and a flat PDMS pad are used for patterning, rather than a SAM and a patterned PDMS stamp. Advantages of using a flat PDMS pad, instead of a patterned PDMS stamp, lie on the easiness of coating a smooth film and the prevention of sagging or pairing among stamp features. The use of polymers provides several advantages as well. Firstly, they may have tunable film thickness, higher etch resistance and large selection of material properties (electronic, optical, or mechanical). Secondly, polymers are not only patternable onto flat or curved surfaces, but also onto surfaces with patterns. The latter is highly desired for creating 3-D structures in micro-electromechanical systems (MEMS) and construction of organic optoelectronics. Lastly, the patterns on topography of the present invention are achieved through controlled deformation of a PDMS pad on a topography, not through chemical bonding.

It is also known to pattern a polymer film on a smooth substrate, instead of a patterned substrate as in the present invention. In the prior art process, a thin film of polymer is first deposited on a smooth substrate and the patterning takes place by applying a PDMS pad in conformal contact to the film, such that protruding elements of the pad are attached to the material surface. In contrast, polymer films according to the present invention are deposited on PDMS directly.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 2(*d*)-(*f*) is a series of cross-sectional views illustrating a method of patterning a whole layer polymer film to form channels on a planar substrate;

DETAILED DESCRIPTION OF THE PREFERRED EMBODIMENTS

The following description of the preferred embodiments is merely exemplary in nature and is in no way intended to limit the invention, its application, or uses.

According to the principles of the present invention, an advantageous method of creating polymer film patterns on topography is provided. With reference to FIGS. 1-8, the method of the present invention is illustrated wherein a soft, elastomeric polydimethylsiloxane (PDMS) pad is used to transfer whole-layer polymer films, portions of the polymer film, or patterned features onto substrates. These substrates may be flat, patterned, or even curved.

Figure 1:
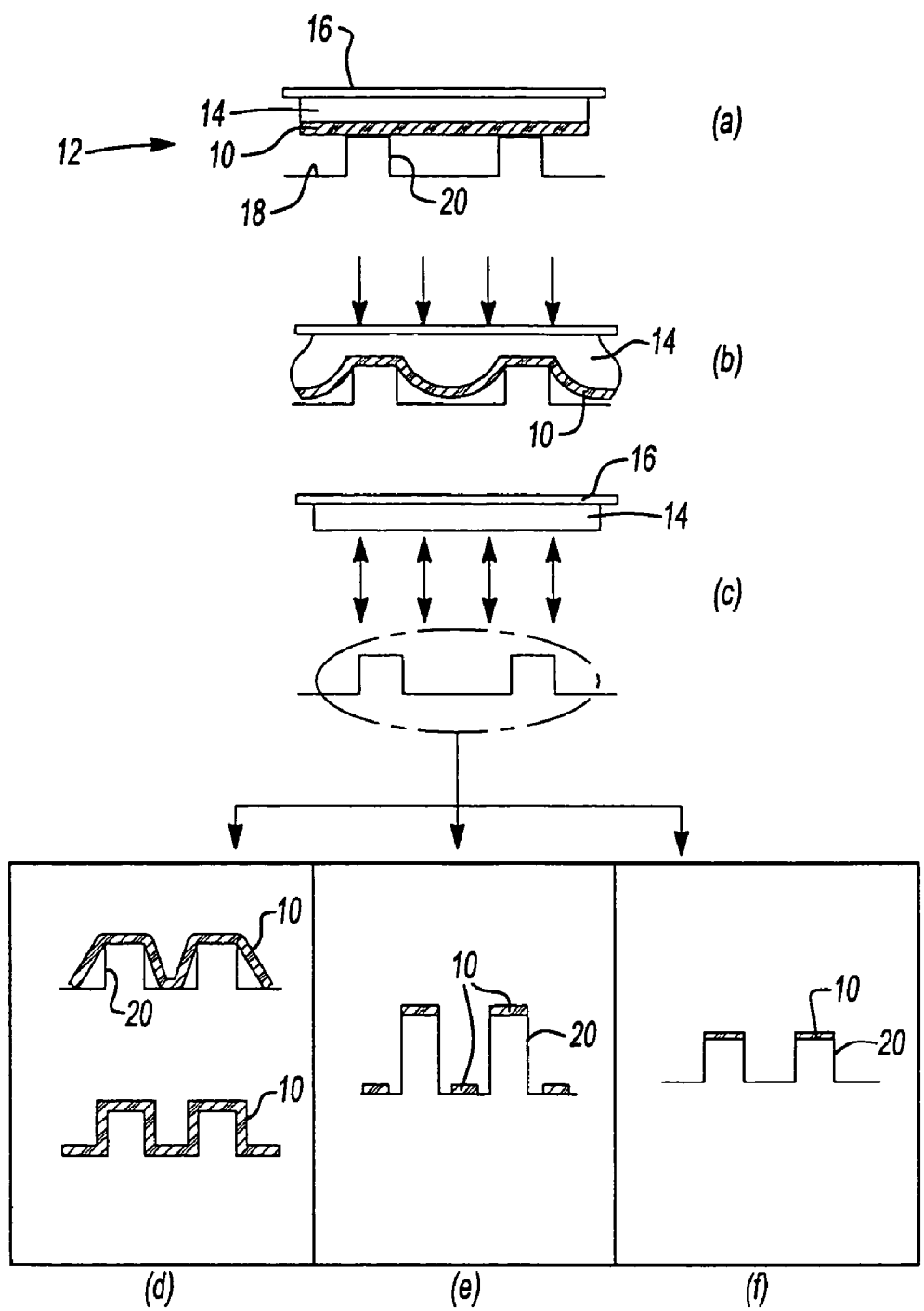
FIGS. 1(*a*)-(*f*) is a series of cross-sectional views illustrating a method of patterning a polymer film on a topography according to the principles of the present invention.
Figure 2:
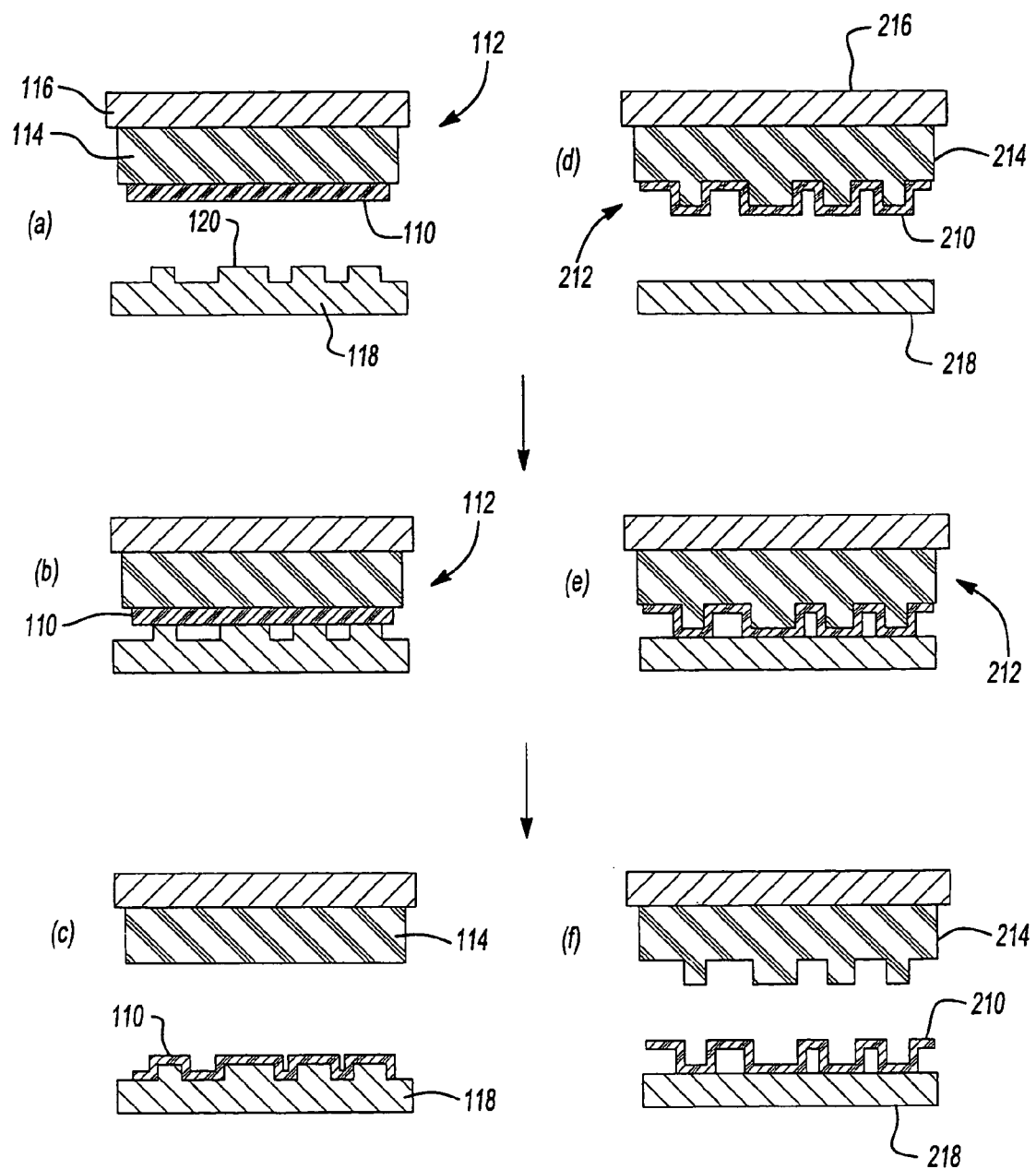
FIGS. 2(*a*)-(*c*) is a series of cross-sectional views illustrating a method of patterning a whole layer polymer film on top, bottom, and sides of a topography to generate a conformal coating layer over the patterns on a substrate.
Figure 3:
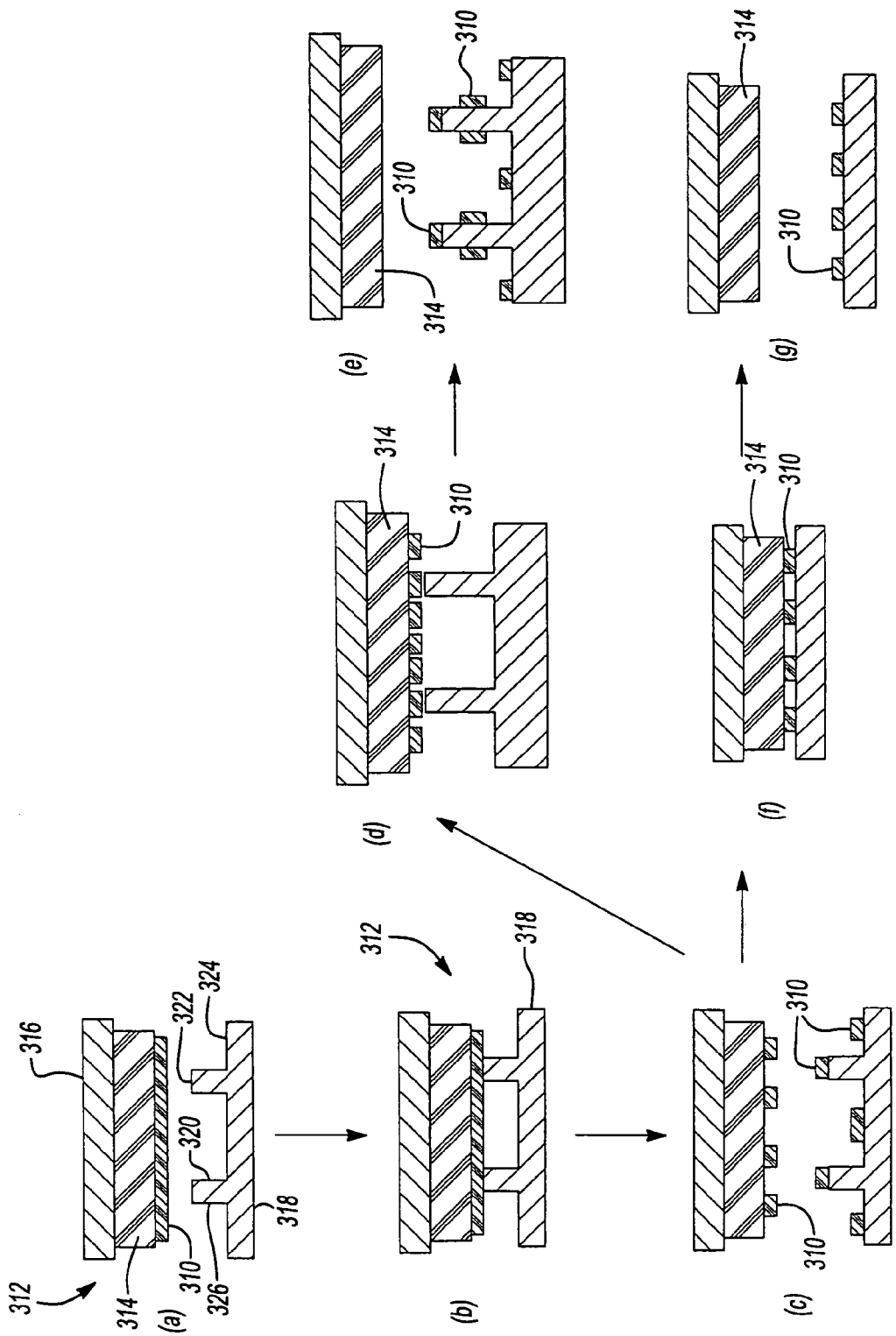
FIGS. 3(*a*)-(*g*) is a series of cross-sectional views illustrating a method of patterning polymer features on top, bottom, and sides of a topography.
Figure 4:
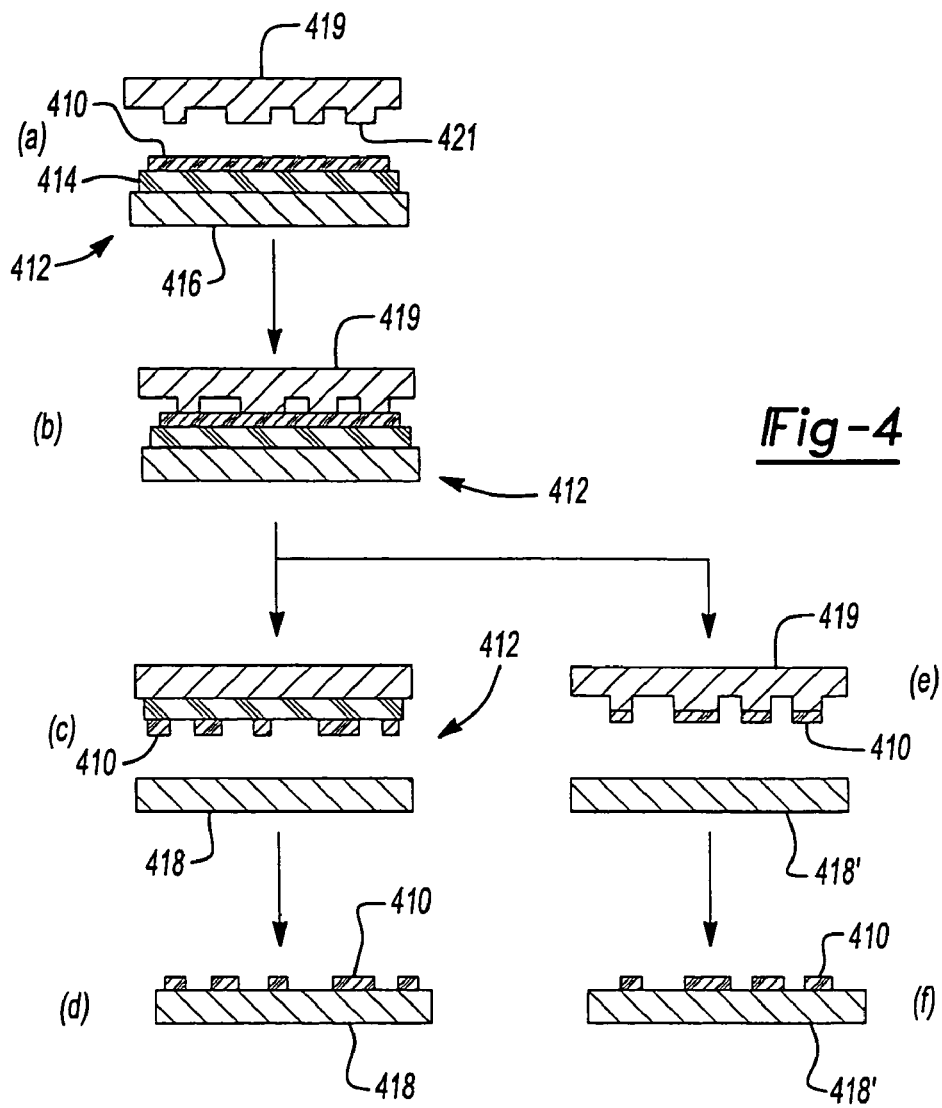
FIGS. 4(*a*)-(*f*) is a series of cross-sectional views illustrating a method of patterning a positive and negative image of a polymer film on substrates.
Figure 5:
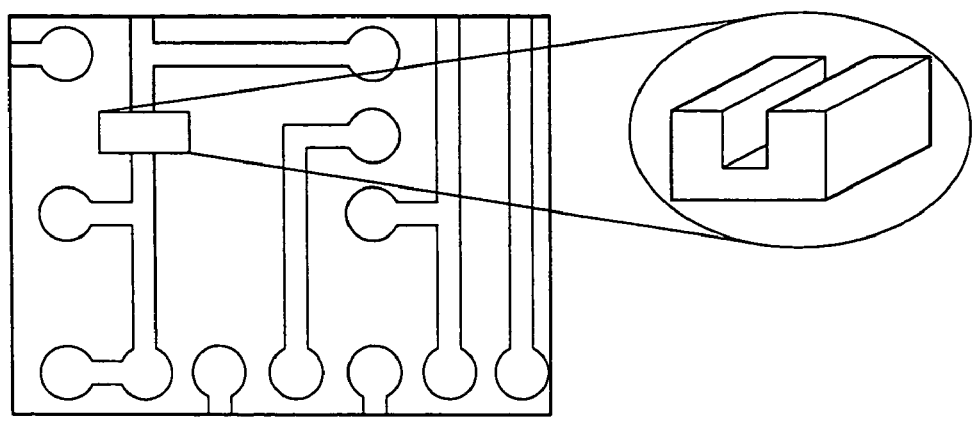
FIG. 5 is a top view of a patterned substrate for use in biomedical applications.
Figure 6:
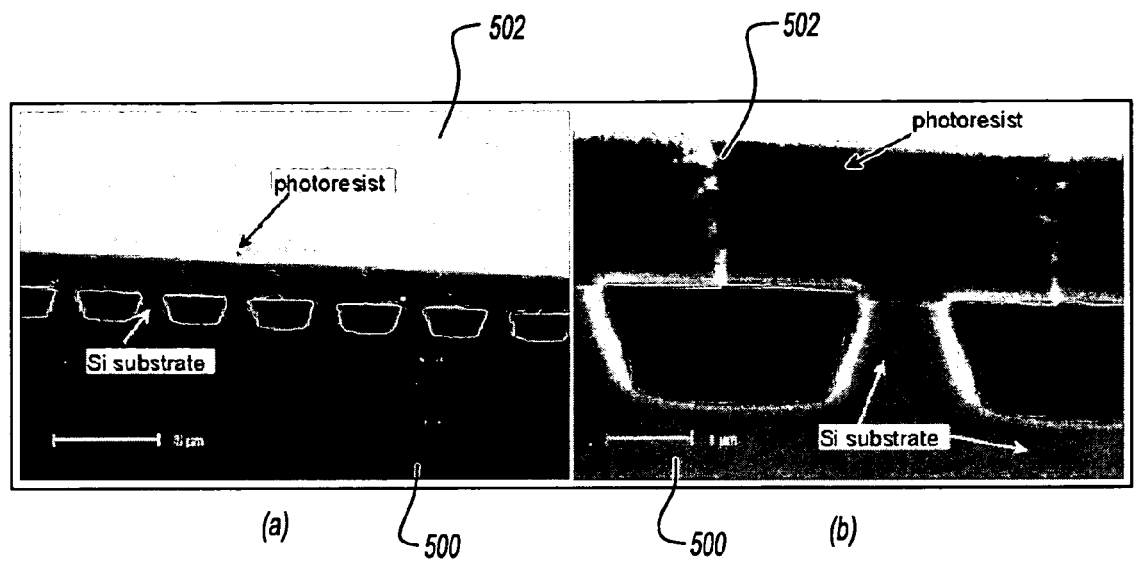
FIGS. 6(*a*)-(*b*) are photographs of micro- and nanometer sized fluidic channels formed in a substrate according to the principles of the present invention.
Figure 7:
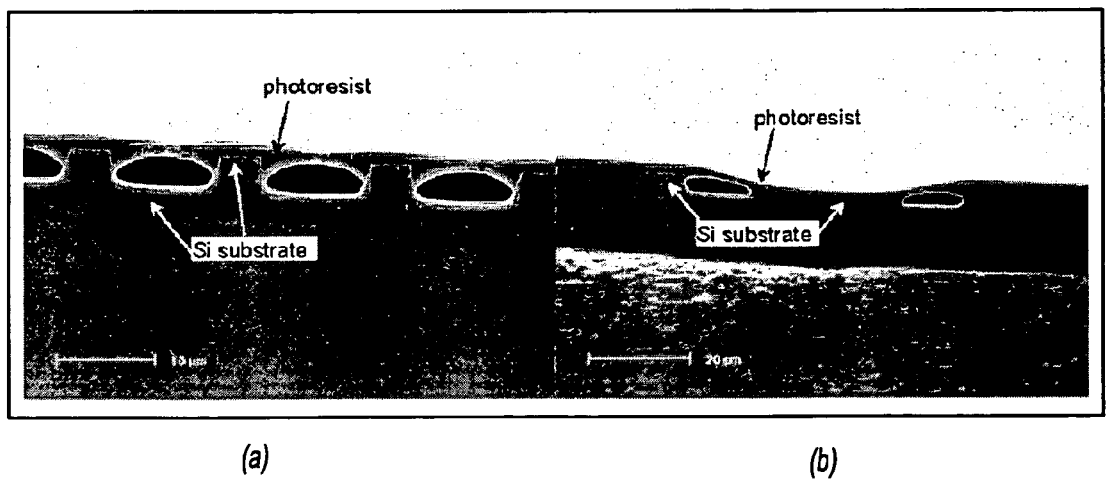
FIGS. 7(*a*)-(*b*) are photographs of shrink channels formed in a substrate according to the principles of the present invention.

Referring now to FIGS. 1(*a*)-(*f*), during the patterning of continuous film, a polymer film 10 is first spin-coated on a PDMS pad 12. PDMS pad 12 is generally comprised of a PDMS layer 14 disposed on a glass slide or other support 16. After polymer film 10 is coated on PDMS pad 12, PDMS pad 12 is then brought into contact with a topography 18 as seen in FIG. 1(*a*). A suitable pressure or temperature is then applied upon polymer film 10. The PDMS pad is treated with an $O_2$ plasma before polymer coating. This treatment increases surface energy of the PDMS, thus promoting polymer adherence on the pad surface. As is known, PDMS will recover gradually to its low interfacial energy state that is, polymer materials will be released from the pad easily. Therefore, successful film patterning from PDMS pad 12 to topography 18 occurs when adequate adhesion between polymer film 10 and topography 18 is achieved. In a typical imprinting process, a temperature of T~Tg±20° C. is usually required to assure good adhesion.

During the application of pressure, PDMS pad 12 deforms around protrusions 20 extending from topography 18, as seen in FIG. 1(b). This deformation causes portions of polymer film 10 to extend between protrusions 20. During such process, polymer film 10 acts as a deformation barrier for the elastic deformation of PDMS layer 14. That is, polymer film 10 exhibits plastic deformation, thereby retaining the shape imposed during application of pressure when forming. However, PDMS layer 14 exhibits elastic deformation and, thus, upon removed of the applied pressure on PDMS pad 12, PDMS layer 14 rebounds to its original state. This elastic deformation of PDMS layer 14 and the plastic deformation of polymer film 10 causes PDMS layer 14 to peel away from polymer film 10 as pressure is relieved and PDMS layer 14 rebounds, as seen in FIGS. 1(c)-(f). At a constant applied pressure, the deformation of polymer film 10 between protrusions 20 is dependent on the imprinting temperature and the dimensions of topography 18 dimension. These variations result in various film patterns over topography 18 as seen in FIGS. 1(d)-(f). Different polymers and plasticizers can be used to control or improve the imprinted film profile.

As should be appreciated from the foregoing, the use of PDMS as the imprinting pad in the present method is capable of transferring the polymer film 10 onto a topography 18 of any shape. This capability does not currently exist with known application methods, such as conventional spin-coating process, NIL, or photolithography technique. Since PDMS pad 12 can be deformed mechanically around protrusions 20 of topography 18, the profile of the imprinted polymer film 10 depends on the dimensions of topography 18, polymer properties, and the temperature and pressure conditions of imprinting. As can be seen in FIGS. 1(d)-(f), three distinctive film patterns can be achieved. For example, as seen in FIG. 1(d), whole-layer-polymer-film-over-topography can be realized to form coating over topography. The specific results are dependent upon the specific temperatures. For example, when the temperature is less than Tg and the trenches are shallow, the polymer film can be transferred onto the topography nonconformally, thus forming channels between the polymer film and the substrate. When the temperature is greater than Tg and the trenches are shallow, the polymer coating becomes conformal and covers all sides (top, sidewalls, and bottom) of the trenches. As seen in FIG. 1(e), polymer film 10 can be deposited on both trenches and protrusions for deep trenches since the polymer breaks off and does not coat the sidewalls. Still further, as seen in FIG. 1(f), polymer film 10 can be deposited only on the top surface of protrusions 20 under low pressure and temperature larger than Tg. A negative replica of topography 18 on PDMS is simultaneously created in the last patterning process and can be further utilized in the present patterning technique. Specifically, it affords capability of patterning a patterned film from PDMS to the sidewalls of topography. Due to the great versatility of this patterning technique, it provides an approach to form micro- or nanometer sized patterns inside trenches and can have many applications in the fabrication of microelectromechanical system (MEMS), electronic, or photonic devices.

With greater detail and reference to FIGS. 2(a)-(f), whole layer polymer film transfer onto topography for conformal coating (FIGS. 2(a)-(c)) and channel forming (FIGS. 2(d)-(f)) is illustrated. Specifically, with reference to FIGS. 2(a)-(c), PDMS pad 112 is shown having a hard substrate or glass slide 116 in which a soft elastomer pad 114 is fixed thereto and includes a spin-coated polymer layer 110 disposed thereon. As illustrated, soft elastomer pad 114 is generally planar in cross-section. Substrate 118 to be imprinted includes protrusions 120. As PDMS pad 112 is brought in contact with substrate 118, soft elastomer pad 114 deforms to conform to the topography of substrate 118. Once PDMS pad 112 is removed, whole polymer layer 110 is deposed conformally over the features on the substrate 118.

Similarly, with reference to FIGS. 2(d)-(f), PDMS pad 212 is shown having a hard substrate or glass slide 216 in which a soft elastomer pad 214 is fixed thereto and includes a spin-coated polymer layer 210 disposed thereon. As illustrated, soft elastomer pad 214 is contoured to define a varied cross-sectional profile having a plurality of protrusions 215. Substrate 218 to be imprinted is generally planar. As PDMS pad 212 is brought in contact with substrate 218, soft elastomer pad 214 deforms briefly to define a contact bond between polymer layer 210 and substrate 218 that is greater than a contact bond between polymer layer 210 and soft elastomer pad 214 to permit the removal of polymer layer 210 from soft elastomer pad 214 upon raising of PDMS pad 212. After PDMS pad 212 is removed, whole polymer layer 210 is deposed across substrate 218 to define channels consistent with a shape formed on soft elastomer pad 214.

Referring now to FIGS. 3(a)-(g), polymer film can be deposited on both trenches and protrusions of a substrate. Specifically, PDMS pad 312 is shown having a hard substrate or glass slide 316 in which a soft elastomer pad 314 is fixed thereto and includes a spin-coated polymer layer 310 disposed thereon. As illustrated, soft elastomer pad 314 is generally planar in cross-section. Substrate 318 to be imprinted includes protrusions 320. As PDMS pad 312 is brought in contact with substrate 318, soft elastomer pad 314 deforms to conform to the topography of substrate 318. Depending upon the application pressure, temperature, and polymer makeup, polymer layer 310 may be deposited on the tops 322, the bottoms 324, and sides 326 of protrusions 320.

After the polymer pattern is generated on PDMS pad (FIG. 3c), this pattern can be transferred to either a flat (FIG. 3g) or a patterned substrate (FIG. 3e). This is accomplished by bringing the patterned PDMS pad into contact with a new substrate. Referring to FIG. 3e, depending on the dimensions of the new substrate and imprinting pressure/temperature, not only can patterns on PDMS pad be transferred to tops, bottoms, and sides of the protrusions, but the trenches between these protrusions can be also coated. Alternatively, patterns from the PDMS pad are simply transferred to a flat substrate (FIG. 3c). In these two cases, the new substrate can be either soft in mechanical strength or curved in shape, i.e., patterning is not limited by the substrate hardness shape. Such capability to pattern various substrates has many applications in portable electronic, photonic, or biomedical devices.

Referring now to FIGS. 4(a)-(f), positive and negative polymer film transfer can be completed. Specifically, PDMS pad 412 is shown having a hard substrate or glass slide 416 in which a soft elastomer pad 414 is fixed thereto and includes a spin-coated polymer layer 410 disposed thereon. As illustrated, soft elastomer pad 414 is generally planar in cross-section. An intermediate mold 419 is illustrated having a series of protrusions 421. A first substrate 418 and a second substrate 418' are provided as substrates to receive negative and positive pattern imprints, respectively. PDMS pad 412 is first brought in contact with intermediate mold 419. Intermediate mold 419 includes a surface energy that is greater than soft elastomer pad 414, yet less than a surface energy of first substrate 418 and second substrate 418'. As PDMS pad 412 is brought in contact with intermediate mold 419, a portion of polymer layer 41 0, representing a positive image is transferred to intermediate mold 419. A remaining portion of polymer layer 410 remains on soft elastomer pad 414, representing a negative image. PDMS pad 412, having the negative image, is then brought in contact with first substrate 418. Because the surface energy of first substrate 418 is greater than soft elastomer pad 414, the negative image of polymer layer 410 is transferred to substrate 418. Similarly, intermediate mold 419, having the positive image, is then brought in contact with second substrate 418'. Because the surface energy of second substrate 418' is greater than intermediate mold 419, the positive image of polymer layer 410 is transferred to substrate 418'.

Because the present invention is a dry process, topographies (i.e. substrates) sensitive to solvents may now be imprinted according to the principles of the present invention. Existing methods such as spin coating, spray coating, or free radical polymerization method are not dry processes and, thus, have no such versatility. Still further, because the present invention is a dry coating process, it could further be used to construct multiple layer structures in OLEDs. An efficient OLED needs multiple layers to conduct electrons and holes separately. However, conventional coating processes, such as spin-coating, require that the two neighboring layers have significantly different solubility; otherwise, the lower layer dissolves upon application of the upper layer. This limitation greatly complicates the selection of conducting polymers in the organic electronics application. The present invention provides the opportunity to employ "soft" materials, like polymers, to form multiple layer structures in high resolution, high-throughput, low-cost application with no critical requirements on material chemical structure and their solubility.

The incorporation of small molecules, e.g., plasticizers, into polymer films along with PDMS pad 12 can achieve sealing microstructures on substrates. This includes either covering protruded parts with smooth and continuous film profile or producing micro- or nanometer sized channels between protruded parts. The latter achievement is highly dependent on the pattern dimensions, polymer properties, and conditions of imprinting.

The present technique of whole-layer film transferring produces smooth and continuous film coverage on substrates with deep depth features. This capability may lead to another potential application—encapsulating circuits with a thin layer of electrostatic dissipative coating. In this regard, a thin layer of conducting polymer, e.g., poly(3,4-ethylenedioxythiophene) (PEDOT), can be transferred from PDMS pad 12 to a substrate having an electronic circuit. Using the method of the present invention, the substrate and circuit may be covered to provide uniform and complete coverage of a polymer film. The film thickness can be greatly varied, depending on the initial polymer concentration before casting on PDMS pad. Typically, this polymer coating can range from 50 nm to 10 μm. This smooth and continuous conducting film layer can distribute static charges on the device and reduce the risk of accumulated voltage shock. In contrast, using conventional spin-costing, thin polymer films of about 80-200 nm will have only limited coverage on such substrate.

Figure 8:
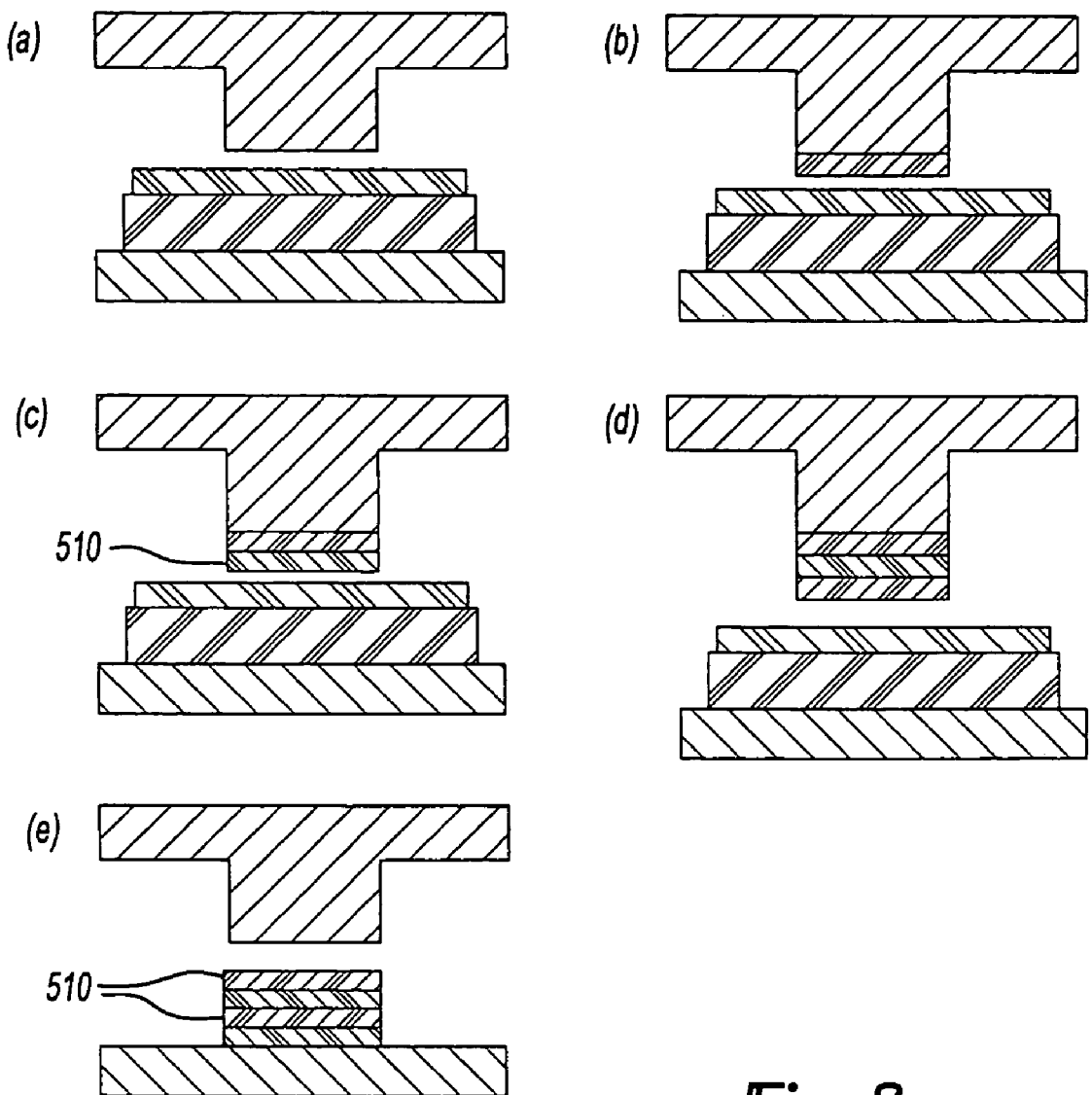
FIGS. 8(*a*)-(*e*) is a series of cross-sectional views illustrating a method of patterning multiple layers of polymer film upon a substrate.

The method of the present invention provides a low cost and high throughput patterning technique. It can be used to generate micro and nano-patterns on any one of a number of varying topographies. Potential applications of this technique include encapsulation of electronic devices with a selection of polymer films (see FIG. 5); construction of micro- or nanometer sized channels, lines, or dots for micro-fluidics (see FIGS. 6(*a*)-(*b*)) where substrates 500 are patterned according to the present invention and covered using photoresist 502; or construction of optoelectronic devices. Additionally, the principles of the present invention may also be used to partially "fill in" existing channels in a substrate to define smaller dimensions not otherwise manufacturable (see FIG. 7(*a*)-(*b*)). Still further, as seen in FIGS. 8(*a*)-(*e*), multiple layers of polymer film 510 may be applied consecutively according to the techniques described above to achieve desired properties.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of applying a pattern on a non-planar substrate, said method comprising:
    applying a multi-layer polymer film to a planar elastomer member to form a pad;
    applying said pad to the non-planar substrate under pressure;
    transferring said polymer film from said elastomer member to the non-planar substrate in response to surface energy differences between said elastomer member and said non-planar substrate and said pressure;
    removing said elastomer member from said polymer film and the non-planar substrate; and
    varying a thickness of said elastomer member to vary a depth of features on said non-planar substrate to which said polymer film is applied.

2. The method according to claim 1, further comprising:
    treating said elastomer member with a plasma prior to said applying a polymer film to said elastomer member to temporarily enhance bonding.

3. The method according to claim 1 wherein said applying a polymer film to an elastomer member comprises patterning said polymer film to said elastomer member to form a predetermined patterned shape for said polymer film.

4. The method according to claim 1, further comprising:
    mixing a plasticizer to said polymer film to improve processability.

5. The method according to claim 1 wherein said non-planar substrate defines a trench top, a trench bottom, and trench sides, said step of transferring said polymer film from said elastomer member to the non-planar substrate including transferring said polymer film to one of a group consisting essentially said trench top only, said trench top and said trench bottom only, and said trench top, said trench bottom, and said trench sides only.

6. The method according to claim 1 wherein said applying a polymer film to an elastomer member comprises applying a polymer film to an elastomer member according to one of the method chosen from the group of spray coating, dip coating, and spin coating.

7. A method of applying a pattern on a substrate, said substrate having a non-planar topography, said method comprising:
    providing a first member, said first member being elastically deformable at a predetermined pressure, said first member defining a first shape;
    providing a second member, said second member being plastically deformable at said predetermined pressure, said second member defining a second shape;
    disposing said second member on said first member to form a pad;
    applying said pad against the substrate at said predetermined pressure causing said first member to elastically deform into a third shape and said second member to plastically deform in a fourth shape; and removing said pad from said substrate such that said first member returns to said first shape and said second member remains in said fourth shape and attached to said substrate.

8. The method according to claim 7 wherein said disposing said second member on said first member comprises disposing said second member on said first member to form a predetermined patterned shape of said second member.

9. The method according to claim 7, further comprising:

varying a thickness of said first member to vary a depth of features on said substrate to which said second member is applied.

10. The method according to claim 7, further comprising:

treating one of said substrate and said first member to temporarily vary the surface adhesion between said second member and said one of said substrate and said first member.

11. The method according to claim 10 wherein said treating one of said substrate and said first member includes treating only a portion of said one of said substrate and said first member.

* * * * *

UNITED STATES PATENT AND TRADEMARK OFFICE
CERTIFICATE OF CORRECTION

PATENT NO. : 7,618,510 B2 Page 1 of 1
APPLICATION NO. : 10/558032
DATED : November 22, 2005
INVENTOR(S) : Li Tan et al.

It is certified that error appears in the above-identified patent and that said Letters Patent is hereby corrected as shown below:

Column 3, line 13, "removed" should be --removal--.

Column 5, line 1, "41 0" should be --410--.

Column 5, line 58, "spin-costing" should be --spin-coating--.

Column 6, line 47, After "essentially", insert --of--.

Signed and Sealed this

Twenty-third Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,618,510 B2
APPLICATION NO. : 10/558032
DATED : November 17, 2009
INVENTOR(S) : Tan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 374 days.

Signed and Sealed this

Twenty-sixth Day of October, 2010

David J. Kappos
*Director of the United States Patent and Trademark Office*